(12) United States Patent
Alapati et al.

(10) Patent No.: US 7,659,210 B2
(45) Date of Patent: Feb. 9, 2010

(54) NANO-CRYSTAL ETCH PROCESS

(75) Inventors: Ramakanth Alapati, Boise, ID (US); Paul Morgan, Boise, ID (US); Max Hineman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/748,196

(22) Filed: May 14, 2007

(65) Prior Publication Data

US 2008/0286975 A1   Nov. 20, 2008

(51) Int. Cl.
*H01L 21/302* (2006.01)

(52) U.S. Cl. .............. 438/720; 438/255; 438/706; 438/722

(58) Field of Classification Search ............ 438/706, 438/710, 712, 720, 253, 254, 718, 722, 255
See application file for complete search history.

(56) References Cited

U.S. PATENT DOCUMENTS

| | | | | |
|---|---|---|---|---|
| 5,731,130 | A * | 3/1998 | Tseng | 430/316 |
| 6,245,650 | B1 * | 6/2001 | Watanabe | 438/580 |
| 6,444,512 | B1 | 9/2002 | Madhukar et al. | |
| 6,764,896 | B2 * | 7/2004 | Okudaira | 438/238 |
| 7,125,762 | B2 | 10/2006 | Brask et al. | |
| 7,125,770 | B2 | 10/2006 | Lee | |
| 7,163,862 | B1 | 1/2007 | Wiseman et al. | |
| 7,358,138 | B2 * | 4/2008 | Lee | 438/264 |
| 2002/0011465 | A1 * | 1/2002 | Yamamoto et al. | 216/75 |
| 2004/0180491 | A1 | 9/2004 | Arai et al. | |
| 2005/0287717 | A1 | 12/2005 | Heald et al. | |
| 2006/0040103 | A1 | 2/2006 | Whiteford et al. | |
| 2006/0081911 | A1 | 4/2006 | Batra et al. | |
| 2006/0266442 | A1 | 11/2006 | Narayan et al. | |
| 2006/0278917 | A1 | 12/2006 | Forbes et al. | |
| 2007/0007635 | A1 | 1/2007 | Forbes et al. | |
| 2007/0010061 | A1 | 1/2007 | Forbes et al. | |

OTHER PUBLICATIONS

Loyd Case, "Intel Takes Wraps Off 45 nm Penryn", Jan. 26, 2007, www.channelinsider.com.
Kavalieros et al., "Tri-Gate Transister Architecture with High-k Gate Dielectrics, Metal Gates and Strain Engineering", Components Research, Technology and Manufacturing Group, Intel Corporation.
Barnett et al., Cleaning's Role in High-k/Metal Gate Success, Semiconductor International, Feb. 1, 2006.

* cited by examiner

*Primary Examiner*—Lan Vinh
(74) *Attorney, Agent, or Firm*—Dinsmore & Shohl LLP

(57) ABSTRACT

A method for selectively removing nano-crystals on an insulating layer. The method includes providing an insulating layer with nano-crystals thereon; exposing the nano-crystals to a high density plasma comprising a source of free radical chlorine, ionic chlorine, or both to modify the nano-crystals; and removing the modified nano-crystals with a wet etchant.

20 Claims, 2 Drawing Sheets

NANO-CRYSTAL ETCH PROCESS

BACKGROUND OF THE INVENTION

The present invention relates generally to methods of making semiconductor devices. More particularly, the invention relates to a method of removing nano-crystals during the manufacture of a semiconductor device.

Flash memory devices in which electrons are stored in nano-crystals rather than floating gates have been developed. For example, such devices are described in US Application Publication No. 2006/0081911, which is incorporated herein by reference. FIG. 1 shows a floating gate n-channel MOS electron memory device. The memory device 100 includes a substrate 105. The substrate is selected based on the type of device.

There is a first gate insulating layer 110 on the substrate 105. The first gate insulating layer 110 can be made of any suitable insulating material, including, but not limited to, silicon dioxide, silicon nitride, silicon oxynitride, a high constant dielectric insulator such as HfSiO, or a stack of layers including at least one barrier layer and at least one high dielectric constant layer. If a high constant dielectric layer is used, a barrier layer (not shown) can be formed between the high constant dielectric layer and the substrate.

Noble metal nano-crystals 115 are formed on the first gate insulating layer 110. The noble metal nano-crystals can be formed using any suitable process, including, but not limited to, chemical vapor deposition, atomic layer deposition, or physical vapor deposition. The noble metal nano-crystals are made of various noble metals including, but not limited to, platinum, rhodium, ruthenium, and the like.

A second gate insulating layer 120 is formed over the noble metal nano-crystals 115. The nano-crystals 115 are formed to be separate and isolated crystals. The second gate insulating layer 120 is formed over and between the nano-crystals 115. The second gate insulating layer 120 can be any suitable insulating material including, but not limited to, $Al_2O_3$, or $HfO_2$.

A barrier layer or silicon dioxide layer (not shown) can be formed over second gate insulating layer 120 when the second gate insulating layer is a high constant dielectric layer.

A polysilicon gate layer 125 is formed on the second gate insulating layer 120. The polysilicon gate layer 125 can be made of materials including, but not limited to, polysilicon, tungsten, tungsten-nitride, polysilicon/tungsten-silicide, polysilicon/tungsten-silicide/tungsten, and polysilicon/tungsten-nitride/tungsten.

An insulating layer 130 is formed on the polysilicon gate layer 125. The insulating layer 130 can be made of suitable insulating materials including, but not limited to, silicon oxide, or silicon nitride.

During manufacture of the device, removing of various layers is required. When the nano-crystals are made of platinum, removing the platinum nano-crystals is difficult. Platinum etch processes are predominantly physical, as opposed to chemical, etches. One typical platinum etch process involves biasing the chuck on which the device is placed and sputtering the platinum to remove it. However, the sputtering process has very low etch selectivity for the underlying tunnel oxide layer. The tunnel oxide is attacked during the sputtering process and damaged.

Therefore, there is a need for an improved removal process for nano-crystals.

DESCRIPTION OF THE INVENTION

Figure 1:
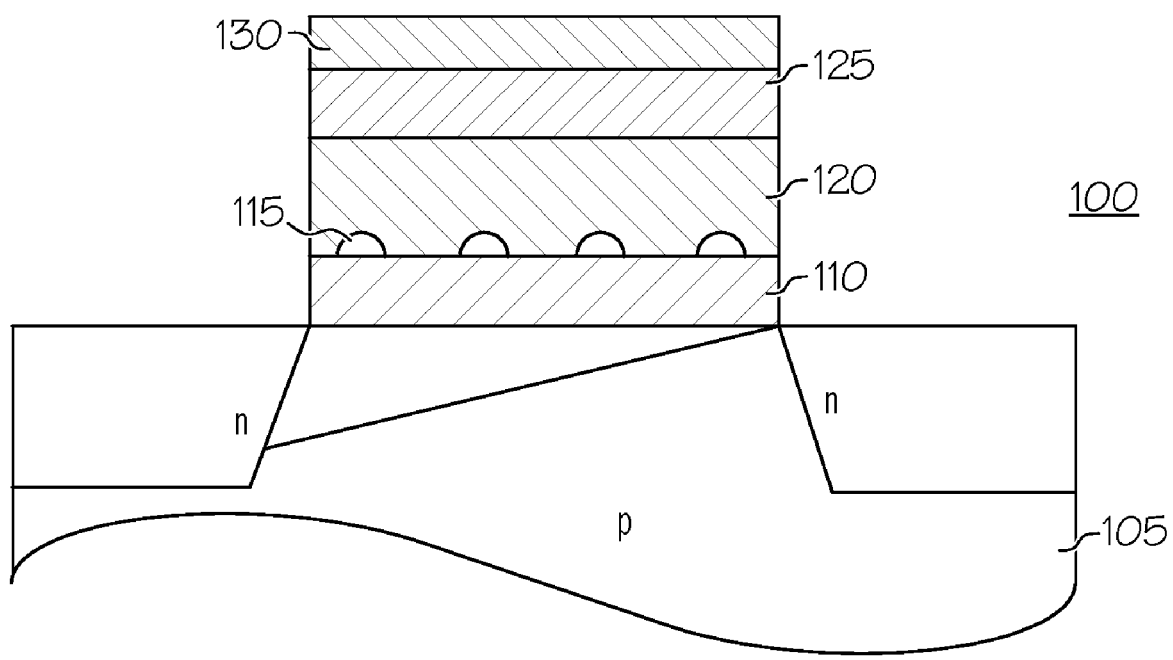
FIG. 1 is a sectional view of a device including nano-crystals.

The methods of the present invention provide a way to remove nano-crystals without damaging the underlying material.

Common wet etchants, such as dilute HF, do not remove platinum nano-crystals. However, we have found that exposing the platinum nano-crystals to low energy free radical or ionic chlorine modifies the platinum nano-crystals so that they can be removed using wet etchants.

The chlorine modification can be used on a variety of nano-crystals, including, but not limited to, platinum, strontium, rhodium, ruthenium, or alloys thereof.

The nano-crystals are chlorinated by the free radical or ionic chlorine liberated from a source of chlorine gas, typically formed by a plasma. High concentrations of free radical and/or ionic chlorine are typically produced by a high density plasma. A plasma with a density of greater than about $10^{10}/cm^3$ can be considered a high density plasma. The high density plasma can be produced using RF plasma produced using Electron Cyclotron Resonance (ECR) or inductively coupled plasma (ICP) sources.

The plasma gas includes a source of free radical chlorine. The source of chlorine includes, but is not limited to, one or more of $BCl_3$, $Cl_2$, and $SiCl_4$. The plasma gas can also include a noble gas, such as Ar, He, Ne, Xe, or Kr. The noble gas helps increase the dissociation of the gases.

The chlorine modification of the nano-crystals occurs at high substrate temperatures. When the nano-crystals are platinum, the substrate temperature should be at least about 300° C.

The device is exposed to the free radical and/or ionic chlorine generally for a time in the range of about 10 sec to about 60 sec, typically about 20 sec to about 40 sec.

The bias power is set to zero, to prevent high energy radical or ion formation. High energy radicals or ions can sputter the underlying the tunnel oxide as well as the nanocrystals.

Because no bias power is used and high density plasma sources are used for plasma generation, the probability of sputtering is reduced, and the probability of chemical modification of Pt is enhanced. The low energy process of the present invention does not attack the tunnel oxide while allowing removal of the platinum nano-crystals.

After the treatment with the free radical or ionic chlorine, the nano-crystals are treated with a standard wet etch, such as very dilute HF or aqua regia. The wet etch treatment removes the nano-crystals without attacking the tunnel oxide.

For example, during manufacture of a device containing nano-crystals, such as a flash memory device, a first insulating layer is formed on a substrate. The first insulating layer (or tunnel oxide) can be made of an oxide or oxynitride. The nano-crystals are formed on the tunnel oxide. The substrate with the tunnel oxide and the nanocrystals is exposed to a high density plasma containing a source of free radical or ionic chlorine. This modifies the nano-crystals. When the nano-crystals are then treated with a wet etch, they are removed without damaging the tunnel oxide. The remaining process steps can then be carried out.

In order that the invention may be more readily understood, reference is made to the following examples which are intended to illustrate the invention, but not limit the scope thereof.

Example 1

Figure 2:
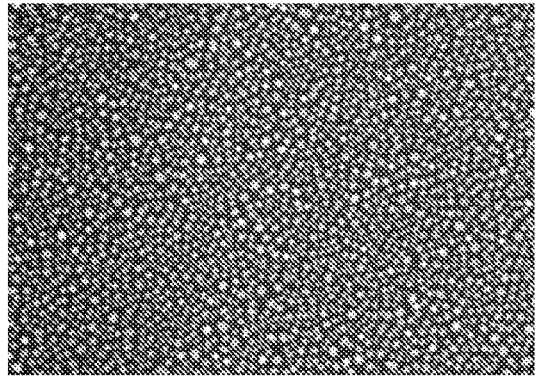
FIG. 2 is a photograph of platinum nano-crystals on silicon oxide.
Figure 3:
FIG. 3 is a photograph of the platinum nano-crystals of FIG. 2 after exposure to a wet etchant of dilute HF.

Platinum nano-crystals were formed on an insulating gate material of silicon oxide. FIG. 2 shows a photograph of the nano-crystals on the silicon oxide. The platinum nano-crystals of FIG. 2 were treated with a wet etch of dilute HF (500:1) for 3 mins at 50° C. FIG. 3 shows the nano-crystals after the wet etch treatment. Although the contrast from FIG. 2 does not appear in FIG. 3, the platinum nano-crystals were not removed.

Figure 4:
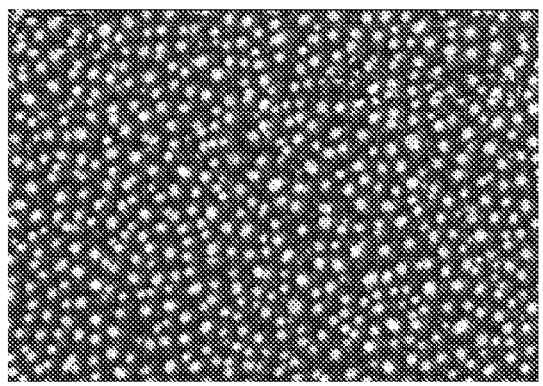
FIG. 4 is a photograph of chlorinated platinum nano-crystals on silicon oxide.
Figure 5:
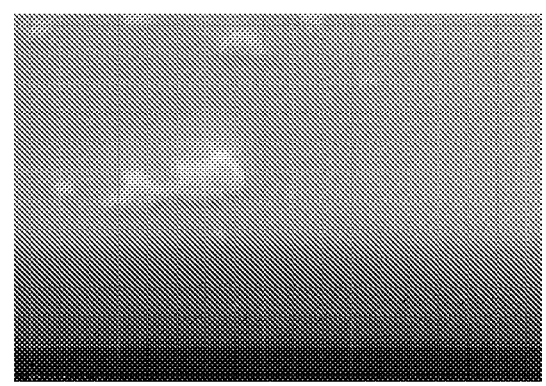
FIG. 5 is a photograph of the silicon oxide of FIG. 4 after exposure to a wet etchant of dilute HF.

Platinum nano-crystals on silicon oxide were treated in a high density plasma containing free radical chlorine. The plasma was an RF plasma with $BCl_3$ (75 sccms), $Cl_2$ (175 sccms), and Ar (100 sccms). The plasma treatment took place at a temperature of 325° C. for 30 sec. FIG. 4 shows the platinum nano-crystals following the low energy free radical chlorine treatment. The chlorine-treated platinum nano-crystals were treated with a wet etch of HF (500:1) for 3 mins at 50° C. FIG. 5 shows the removal of the platinum nano-crystals from the silicon oxide after the wet etch treatment.

The present invention provides methods for selectively removing nano-crystals on an insulating layer. One method includes providing an insulating layer with nano-crystals thereon; exposing the nano-crystals to a high density plasma comprising a source of free radical chlorine, ionic chlorine, or both to modify the nano-crystals; and removing the modified nano-crystals with a wet etchant.

Another method includes providing an insulating layer with nano-crystals thereon; exposing the nano-crystals to low energy free radical chlorine, ionic chlorine, or both to modify the nano-crystals; and removing the modified nano-crystals with a wet etchant.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method for selectively removing nano-crystals on an insulating layer comprising:
   providing an insulating layer with strontium or noble metal nano-crystals thereon;
   exposing the nano-crystals to a high density plasma comprising a source of free radical chlorine, ionic chlorine, or both to modify the nano-crystals; and
   removing the modified nano-crystals with a wet etchant without removing the insulating layer.

2. The method of claim 1 wherein the nano-crystals are made of a material selected from platinum, strontium, rhodium, or ruthenium, or alloys thereof.

3. The method of claim 1 wherein the source of free radical chlorine, ionic chlorine, or both, is $BCl_3$, $Cl_2$, or $SiCl_4$, or combinations thereof.

4. The method of claim 1 wherein the high density plasma further comprises a noble gas.

5. The method of claim 1 wherein the insulating layer with the nano-crystals is at a temperature of greater than about 300° C. when exposed to the high density plasma.

6. The method of claim 1 wherein the plasma is RF plasma.

7. The method of claim 1 wherein the wet etchant is selected from HF, or aqua regia, or combinations thereof.

8. The method of claim 1 wherein the insulating layer comprises a metal oxide or metal oxynitride.

9. A method for selectively removing nano-crystals on an insulating layer comprising:
   providing an insulating layer with strontium or noble metal nano-crystals thereon;
   exposing the nano-crystals to low energy free radical chlorine, ionic chlorine, or both to modify the nano-crystals; and
   removing the modified nano-crystals with a wet etchant without removing the insulating layer.

10. The method of claim 9 wherein the nano-crystals are made of a material selected from platinum, strontium, rhodium, or ruthenium, or alloys thereof.

11. The method of claim 9 wherein the low energy free radical chlorine, ionic chlorine, or both is generated from $BCl_3$, $Cl_2$, or $SiCl_4$, or combinations thereof.

12. The method of claim 9 wherein the insulating layer with the nano-crystals is at a temperature of greater than about 300° C. when exposed to the low energy free radical chlorine, ionic chlorine, or both.

13. The method of claim 9 wherein the wet etchant is selected from HF, or aqua regia, or combinations thereof.

14. The method of claim 9 wherein the insulating layer comprises a metal oxide or metal oxynitride.

15. The method of claim 9 wherein the low energy free radical chlorine, ionic chlorine, or both is generated by a high density plasma.

16. The method of claim 15 wherein the plasma is RF plasma.

17. The method of claim 15 wherein the high density plasma further comprises noble gas.

18. A method for selectively removing platinum nano-crystals on an insulating layer comprising:
   providing an insulating layer with platinum nano-crystals thereon;
   exposing the insulating layer with the platinum nano-crystals to a high density plasma comprising $BCl_3$, $Cl_2$, or $SiCl_4$, or combinations thereof to modify the platinum nano-crystals when the insulating layer with the platinum nano-crystals is at a temperature of greater than about 300° C.; and
   removing the modified platinum nano-crystals with a wet etchant.

19. The method of claim 18 wherein the high density plasma further comprises a noble gas.

20. The method of claim 18 wherein the wet etchant is selected from HF, or aqua regia, or combinations thereof.

* * * * *